United States Patent
Chaleix et al.

(10) Patent No.: US 7,662,237 B2
(45) Date of Patent: Feb. 16, 2010

(54) METHOD OF CLEANING THE SURFACE OF A MATERIAL COATED WITH AN ORGANIC SUBSTRATE AND A GENERATOR AND DEVICE FOR CARRYING OUT SAID METHOD

(75) Inventors: Daniel Chaleix, Roupelange (FR); Patrick Choquet, Longeville les Metz (FR); Gérard Baravian, Limours (FR); Bernard Lacour, Saint Michel sur Orge (FR); Vincent Puech, Boulogne Billancourt (FR)

(73) Assignee: USINOR, Puteaux (FR)

( * ) Notice: Subject to any disclaimer, the term of this patent is extended or adjusted under 35 U.S.C. 154(b) by 572 days.

(21) Appl. No.: 10/504,966

(22) PCT Filed: Feb. 19, 2003

(86) PCT No.: PCT/FR03/00541

§ 371 (c)(1),
(2), (4) Date: Feb. 18, 2005

(87) PCT Pub. No.: WO03/078692

PCT Pub. Date: Sep. 25, 2003

(65) Prior Publication Data

US 2005/0145174 A1  Jul. 7, 2005

(30) Foreign Application Priority Data

Feb. 19, 2002  (FR) .................................. 02 02047

(51) Int. Cl.
*C25F 1/00*  (2006.01)
(52) U.S. Cl. ........................... 134/1.1; 134/32; 134/34; 134/37
(58) Field of Classification Search ................ None
See application file for complete search history.

(56) References Cited

U.S. PATENT DOCUMENTS

| 2,867,912 | A |   | 1/1959 | Kritchever |
| 4,189,650 | A | * | 2/1980 | Aaland ....................... 307/108 |
| 4,642,440 | A | * | 2/1987 | Schnackel et al. ...... 219/121.54 |

(Continued)

FOREIGN PATENT DOCUMENTS

| DE | 43 32 866 A1 |   | 3/1995 |
| JP | 09245995 A | * | 9/1997 |

OTHER PUBLICATIONS

Korzec D et al: "Cleaning of Metal Parts in Oxygen Radio Frequency Plasma: Process Study", Journal of Vacuum Science and Technology, Part A, American Institute of Physics, New York, USA, vol. 12, No. 2, Mar. 1, 1994, pp. 369-378, XP 000442717 ISSN: 0734-2101, p. 370.

*Primary Examiner*—Michael Kornakov
*Assistant Examiner*—Eric Golightly
(74) *Attorney, Agent, or Firm*—Sughrue Mion, PLLC

(57) ABSTRACT

A method for the continuous cleaning of the surface of a material (2) which is coated with an organic substance. Steps of the method are: introducing the material (2) into a treatment area which is supplied with a gas stream containing oxygen; earthing the material (2); and generating a plasma by imposing an electric field between the surface of the material (2) and at least one dielectric-covered electrode (3), the electric field being pulsed and providing a succession of positive and negative voltage pulses in relation to the material (2). Moreover, the maximum voltage of the positive pulses U+ is greater than the arc-striking voltage Ua, and the maximum absolute value of the voltage of the negative pulses U− is less than the striking voltage Ua. Also, a generator and a device which are used to carry out this method.

7 Claims, 5 Drawing Sheets

U.S. PATENT DOCUMENTS

| | | | | |
|---|---|---|---|---|
| 4,645,981 | A | * | 2/1987 | Stramke .................. 315/227 R |
| 4,922,099 | A | * | 5/1990 | Masuda et al. .............. 250/324 |
| 5,208,067 | A | * | 5/1993 | Jones et al. ................ 427/97.3 |
| 5,312,529 | A | * | 5/1994 | Antonelli et al. ............ 204/486 |
| 5,389,195 | A | * | 2/1995 | Ouderkirk et al. ............. 216/66 |
| 5,443,998 | A | * | 8/1995 | Meyer ....................... 438/439 |
| 5,458,927 | A | * | 10/1995 | Malaczynski et al. ....... 427/527 |
| 5,472,783 | A | * | 12/1995 | Mosser et al. ................ 428/419 |
| 5,529,631 | A | | 6/1996 | Yoshikawa et al. |
| 5,938,854 | A | | 8/1999 | Roth |
| 5,968,377 | A | * | 10/1999 | Yuasa et al. ............ 219/121.41 |
| 6,060,131 | A | * | 5/2000 | Suzuki et al. ................ 427/570 |
| 6,106,659 | A | * | 8/2000 | Spence et al. .......... 156/345.43 |
| 2002/0008480 | A1 | * | 1/2002 | Yamazaki et al. ...... 315/111.21 |
| 2002/0043336 | A1 | * | 4/2002 | List et al. .................... 156/345 |

\* cited by examiner

METHOD OF CLEANING THE SURFACE OF A MATERIAL COATED WITH AN ORGANIC SUBSTRATE AND A GENERATOR AND DEVICE FOR CARRYING OUT SAID METHOD

FIELD OF THE INVENTION

The present invention relates to a process for cleaning the surface of a material covered with an organic substance, to a particular generator and to a system for implementing this process. More particularly, this process is intended for cleaning metal strip, without being limited thereto.

BACKGROUND OF THE INVENTION

This is because strip output by the various existing manufacturing lines is generally covered with an oil film that may have two origins. Firstly, this film may have been applied by being sprayed with protective oil, so as to protect the surface of the strip against corrosion. However, it may also be a residual oil film in the case of strip coming from a cold rolling mill or skin-pass. In both cases, oil covering weights are of the order of about a hundred mg per m$^2$.

To deposit a metal or organic coating on such strip requires the removal of the oil film through a cleaning or degreasing operation followed by a brightening operation, in order to obtain good adhesion of this coating. The techniques generally used for this purpose on industrial lines have the constraint of not excessively heating up the strip, so as to preserve the mechanical properties of the steel strip.

Thus, the most common of these techniques consists of an alkaline degreasing operation which may or may not be assisted by an electrolytic process. For environmental reasons, this process requires the installation of complex ancillary workshops for reprocessing the ecotoxic co-products.

Other technical solutions prevent the formation of these co-products, such as for example laser ablation, which has the effect of desorbing the organic compounds photochemically, but at the present time it does not yet allow strip to be treated at speeds exceeding a few meters per minute for lack of laser power.

Moreover, U.S. Pat. No. 5,529,631 teaches that one advantageous surface treatment technique consists in using a high-pressure plasma produced by means of dielectric barrier discharges in gas mixtures containing predominantly helium. This rare gas is in fact necessary in order to obtain a stable glow discharge, thus preventing it from passing into arc mode, which would lead to a nonuniform treatment. The helium content must in this case be greater than 70% by volume, which means that the oxygen content is limited. The examples cited in the patent show that a plasma treatment carried out continuously in these gas mixtures is then sufficient to increase the surface energy of a polymer. However, in the case of a plasma treatment used to clean a metal surface, it is only the reactive oxygen species (O$^\bullet$, etc.) formed in the plasma which oxidize the oil coating the strip which allow the carbon chains to be converted into volatile species. It is therefore observed that the treatment is not sufficiently rapid, probably because of the low density of reactive oxygenated species if electric discharges are used with gas mixtures having oxygen contents of less than or equal to 30% by volume.

To solve this problem, U.S. Pat. No. 5,968,377 discloses a surface treatment process using atmospheric-pressure plasma in which a pulsed electric field is imposed between the electrodes. The imposition of a pulsed electric field makes it possible to cut off the discharge before it passes into arc mode and to re-initiate it at the next instant. The voltage pulses applied have the feature of being symmetrical. However, the present inventors have found that this process cannot be used for cleaning a material covered with an organic substance. This is because it is observed in this case that only part of the organic substance is oxidized and then volatilized and that another part polymerizes. The film thus formed on the surface can be only partly removed, after a long immersion time in the plasma.

SUMMARY OF THE INVENTION

The object of present invention is therefore to remedy the drawbacks of the processes of prior art by providing a process for continuously cleaning the surface of a substrate without obtaining eco-toxic co-products, with a treatment rate of greater than 10 m/min.

For this purpose, a first subject of the invention consists of a process for the continuous cleaning of the surface of a material covered with an organic substance, characterized in that it comprises the steps consisting in introducing said material into a treatment zone supplied with an oxygen-containing gas stream, in grounding said material and in generating a plasma by imposing an electric field between the surface of said material and at least one electrode covered with a dielectric, said electric field being pulsed and comprising a succession of positive and negative voltage pulses with respect to said material, the maximum voltage of the positive pulses U$^+$ being greater than the arc striking voltage U$_a$ and the maximum voltage of the negative pulses U$^-$ being, in absolute value, less than the striking voltage U$_a$.

The present inventors have in particular found that the positive pulse has to be quite high, i.e. greater in absolute value than the arc striking voltage U$_a$ for creating a sufficiently dense plasma in the treatment zone, in order to achieve high cleaning rates.

They have also found that it is essential for the maximum voltage of the negative pulses U$^-$ in absolute value to be less than the striking voltage U$_a$ in order not to initiate an electric discharge between the two electrodes, since the use of too great a negative voltage results in polymerization of the oil, not allowing good degreasing to be obtained.

The value of the arc striking voltage mainly depends on the pressure of the gas in the reactor and on the inter-electrode distance. These parameters are connected through Paschen's law.

The process according to the invention may furthermore have the following features, individually or in combination:
- the voltage rise time of said field is less than or equal to 600 ns, preferably less than or equal to 60 ns;
- the frequency of the positive pulses is greater than or equal to 20 kHz;
- the gas stream consists of air or oxygen;
- the material is a metallic material, preferably a carbon steel;
- the organic substance is an oil for providing temporary corrosion protection, or an unstable mechanical emulsion (oil/water mixture) coming, for example, from the (skin-pass) rolling operation carried out on the metallic material; and
- the material is in the form of a running strip and the various steps of the process are carried out continuously by means of installations placed in succession along the path of the running strip.

A second subject of the invention consists of a generator that can be used for implementing the process according to the invention and which comprises a low-voltage power supply delivering low-voltage pulses at a frequency of 1 to 200 kHz, and components for transforming said low-voltage pulses into high-voltage pulses. The voltage rise time of this generator is preferably less than or equal to 600 ns and more particularly preferably less than or equal to 60 ns.

This generator differs from that described in U.S. Pat. No. 5,968,377 as it makes it possible to obtain unsymmetrical voltage pulses. This is possible since, as opposed to the generator described in U.S. Pat. No. 5,968,377, pulse chopping is not carried out at high voltage, but at low voltage, and then the signal is amplified by means of transformers. Within the context of the present invention, the term "low voltage" is understood to mean a voltage of less than 1 kV.

A third subject of the invention consists of a system for implementing the process according to the invention, which comprises grounded running means for making the strip run, a series of electrodes that are covered with a dielectric and are placed facing that surface of said strip to be treated, these electrodes being connected to a generator according to the invention, gas supply means placed close to the surface of the strip, and means for extracting the gases resulting from the decomposition of the organic substance coating the strip.

Within the context of the present application, the term "dielectric" is understood to mean a material having a dielectric constant of greater than 6. Furthermore, the term "organic substance" is understood to mean any compound containing at least carbon, hydrogen and oxygen. The rise time is defined as being the time during which the voltage continues to increase until it reaches its maximum.

BRIEF DESCRIPTION OF THE DRAWINGS

The invention will be illustrated by the description of one method of implementation given by way of indication, but implying no limitation, with reference to the appended drawings in which.

DETAILED DESCRIPTION OF THE INVENTION

Figure 1:
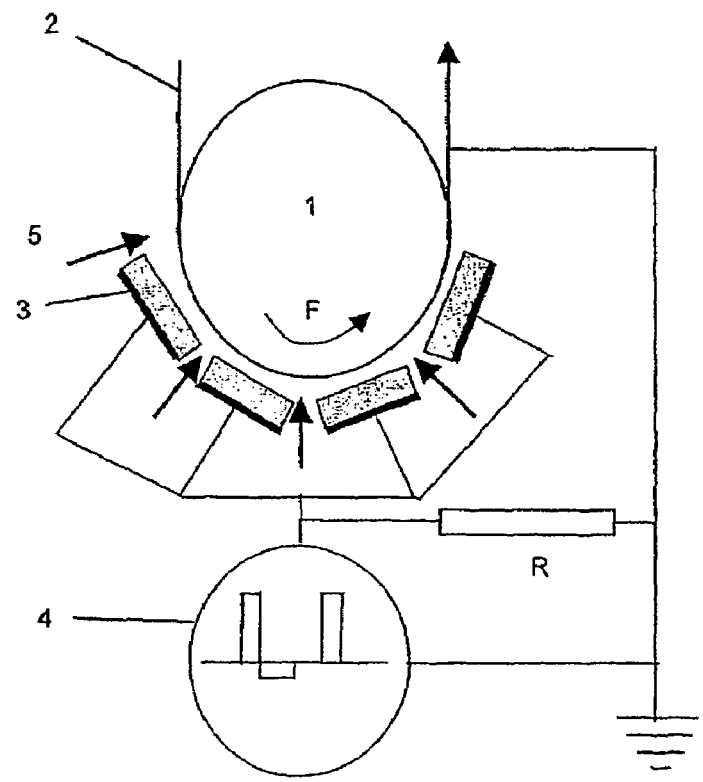
FIG. 1 shows a schematic view of a treatment system according to the invention.

FIG. 1 shows a treatment system that comprises a rotary support roll 1 for a steel strip 2 covered with a corrosion protection oil, that it is desired to degrease. This roll 1 rotates in the direction indicated by the arrow F and may possibly be cooled, if necessary. It is grounded via the strip 2.

Placed facing the roll 1 are several cooled electrodes 3 coated with a dielectric. It would be preferable to choose a ceramic, such as alumina or stumatites for example, as these are able to withstand high temperatures. A dielectric will be chosen that has a dielectric constant of greater than 6, which is the case of alumina, whose dielectric constant is between 8 and 10, but also stumatites, whose constant is between 6 and 8.

Each electrode 3 is supplied by a high-voltage generator 4 according to the invention. The treatment gas or gas mixture may be supplied in various ways, in particular it may be introduced on either side of the electrodes 3 by an injector rail 5. An extraction system may also be provided for extracting the gases and volatile species resulting from the decomposition of the oil film, on each side of the system (these not being shown). To make it easier to supply the zone with gas, it may prove advantageous to place the treatment zone inside a chamber surrounding the strip and the electrodes.

The steel strip 2 is grounded and thus acts as a counterelectrode. It runs over the roll 1 and exposes one of its surfaces to the action of the reactive species created by the action of the discharge on the treatment gas, these being in particular oxygenated species of the O$^•$ type.

The electric discharge is supplied by the generator 4 that delivers, for a frequency possibly varying from 1 to 200 kHz, single-polarity voltage pulses, the waveform of which depends on the load onto which this supply outputs.

Figure 2A:
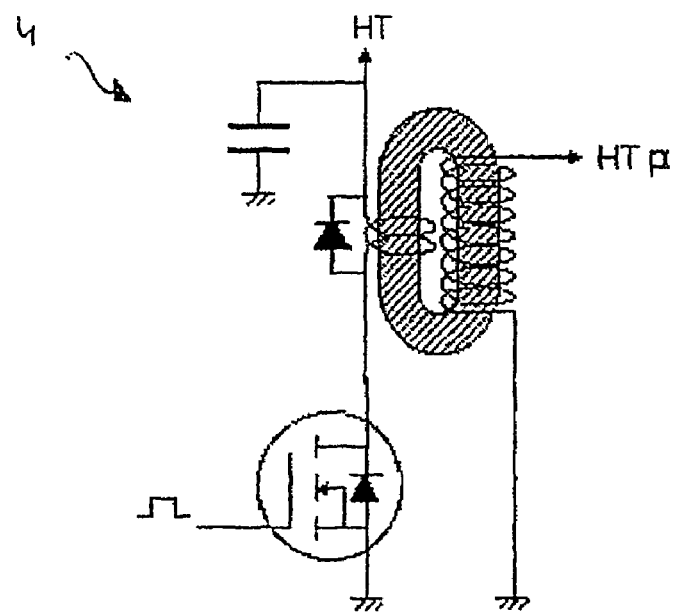
FIG. 2A is a diagram showing the principle of the electrical power supply of the system and FIG. 2B shows its block diagram.

FIG. 2A shows the type of electrical circuit of the pulsed voltage supply, which uses an MOS power transistor connected to a step-up transformer.

Figure 2B:
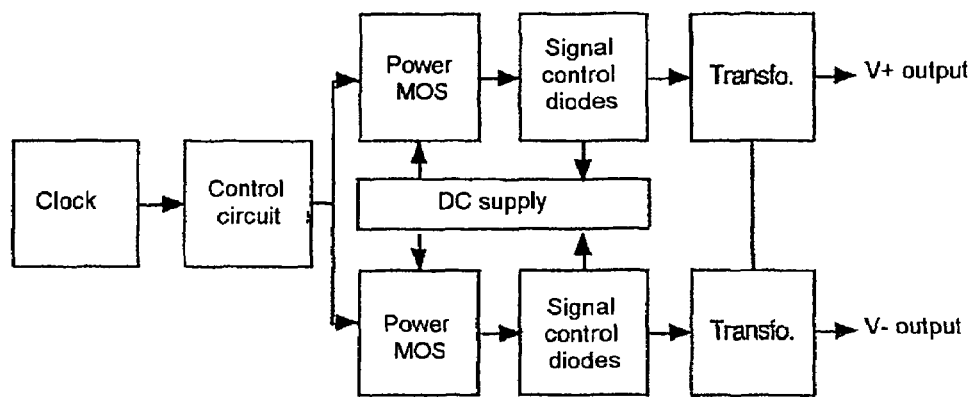

FIG. 2B shows the block diagram of the supply designed specifically for this application. It consists of a block of high-speed diodes, the role of which is to control the voltage and current reversals in the power transistors and in the transformers so as to reduce ohmic losses. The transformers are mounted in a specific manner so as to obtain a low conductance, no saturation of the magnetic material and a low parasitic capacitance.

Figure 3:
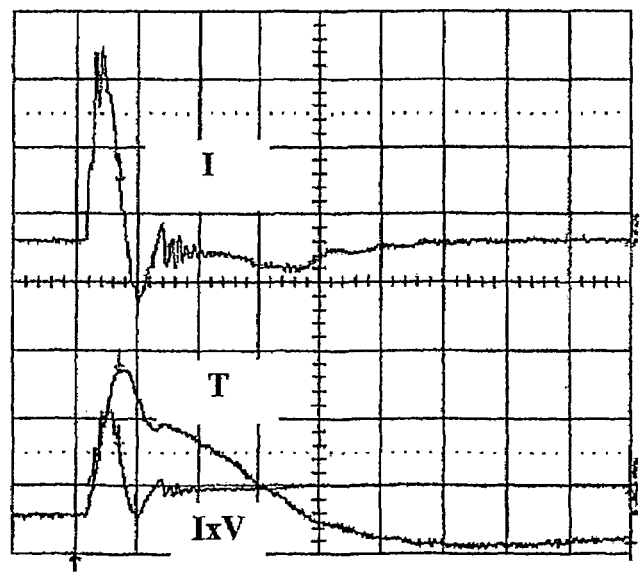
FIG. 3 shows an oscillogram of the voltage variations obtained with a generator according to the invention.

FIG. 3 comprises a curve showing the variations in the voltage during a succession of two pulses such as those delivered by a generator according to the invention.

It may be seen that the first voltage pulse is positive and lasts about 1.8 μs, this being followed by a negative pulse, of lower amplitude, lasting 48.2 μs. The maximum voltage of the positive pulse U$^+$ is in this case 12.7 kV and the maximum value of the negative pulse in absolute value U$^-$ is 1.8 kV. The treatment reactor uses a dielectric barrier (Al$_2$O$_3$) discharge and the inter-electrode distance is set at 3 mm.

During the positive voltage pulse delivered to the dielectric-covered electrode by the electrical generator, a positive current pulse is recorded, which is followed, 4 μs later, by a negative current pulse of lower amplitude. Next, the current is virtually zero when the voltage measured on the dielectric is negative. The positive voltage rise time is around 400 ns. Such a value of the voltage rise time allows the discharge to be struck at a minimum voltage of 5 kV.

EXAMPLE 1

Two specimens of a mild steel strip covered with a corrosion protection oil (Quaker TINNOL N200) were treated by subjecting them to a pulsed electric field according to the invention so as to degrease them. The oil covering weight on each of the strips was 100 mg/m$^2$ and 53 mg/m$^2$ respectively. The treatment was carried out in the presence of a 30 l/min stream of oxygen at atmospheric pressure.

The treatment reactor used a dielectric barrier ($Al_2O_3$) discharge able to contain two rectangular electrodes having the dimensions of 25×200 mm². The inter-electrode distance was 3 mm.

Plasma treatments of various durations were carried out on specimens taken from each of the two strips. The residual protection oil covering weight on each treated specimen was then measured by grazing incidence infrared absorption spectroscopy (IRRAS).

Prior to these experimental measurements, a calibration curve was established on the basis of specimens calibrated in terms of covering weight using the same oil (Quaker TINNOL N200) using the same IRRAS analyzer.

Figure 4:
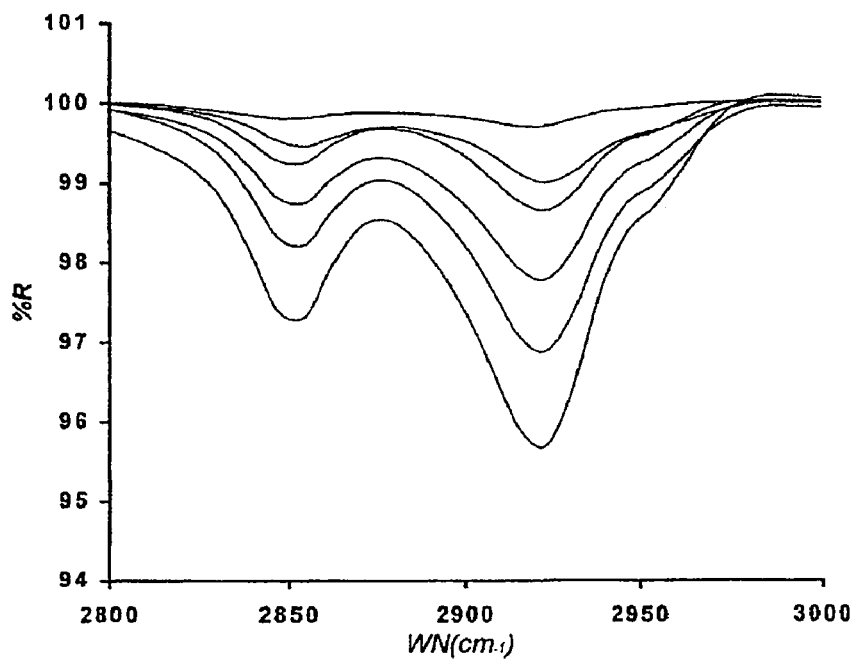
FIG. 4 shows the change in percentage reflectivity (%R) of specimens calibrated in terms of oil coating weight in the wavelength range corresponding to CH stretching bands.

FIG. 4 shows the change in the percentage reflectivity (%R) of specimens calibrated in terms of oil covering weight, within the wavenumber range (expressed in $cm^{-1}$) corresponding to the CH stretching bands. The calibrated specimens contained, starting from the curve closest to the horizontal line, 10 mg/m², 32 mg/m², 50 mg/m², 71 mg/m², 100 mg/m² and 150 mg/m² of oil. No oil on the specimen resulted in a percentage reflectivity of 100%.

Figure 5:
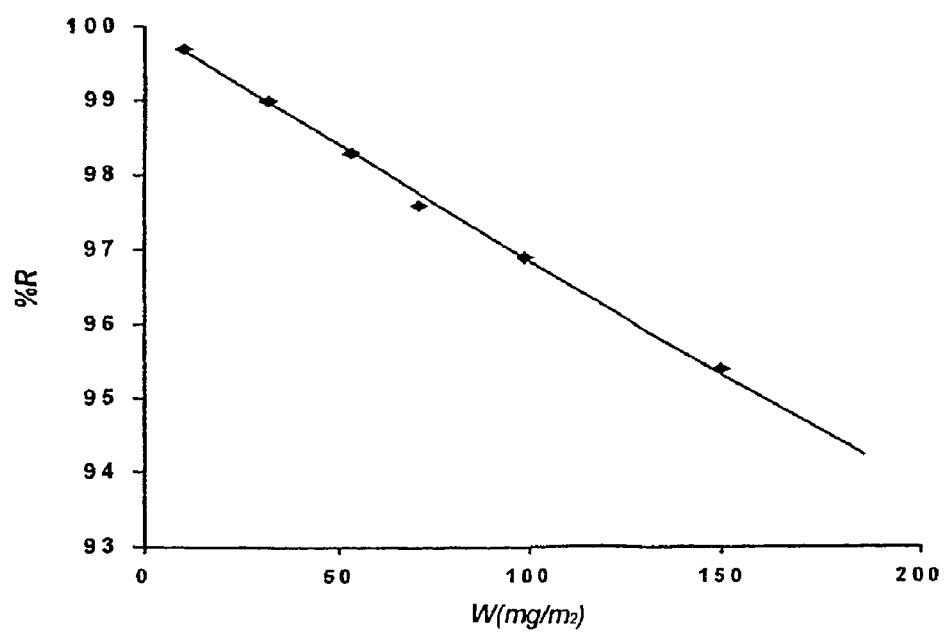
FIG. 5 shows the calibration curve established from the mathematically treated IRRAS recordings.

FIG. 5 shows the calibration curve established on the basis of the IRRAS recordings made for each calibrated specimen.

Figure 6:
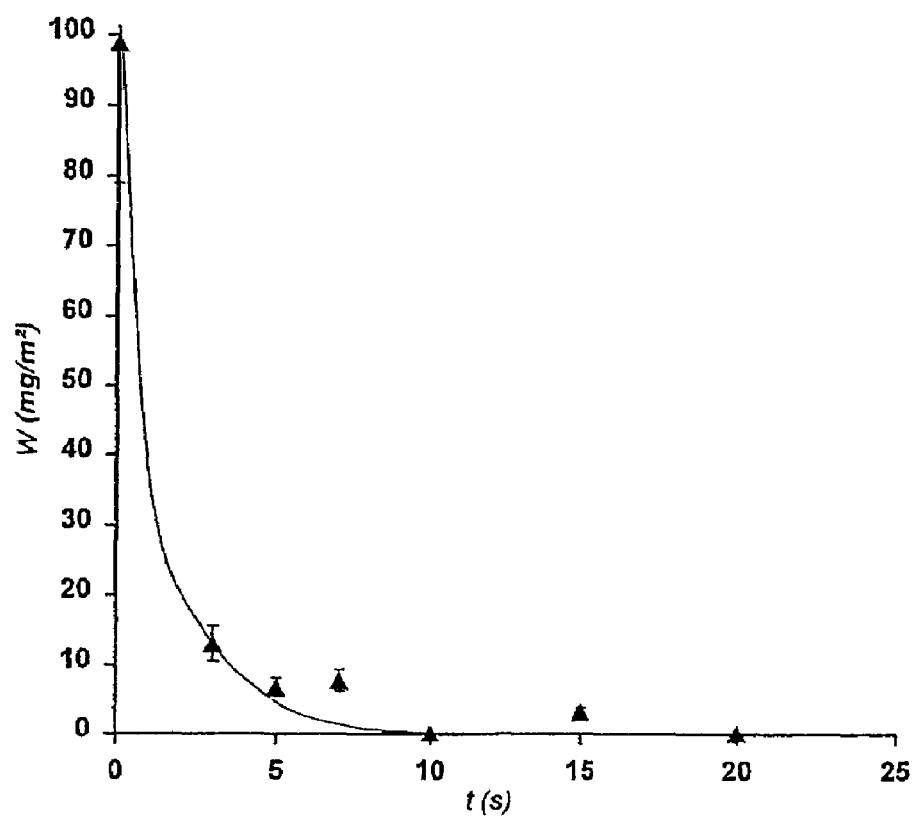
FIG. 6 indicates the change in the residual oil coating weight W as a function of the treatment time on specimens initially coated with 100 mg/m$^2$ of oil.

FIG. 6 shows the change in residual oil covering weight on the specimens taken from the strip with 100 mg/m² of oil after various plasma treatment times, using a frequency of 100 kHz. It may be noted that a time of 7 to 8 seconds is sufficient to clean the strip.

Figure 7:
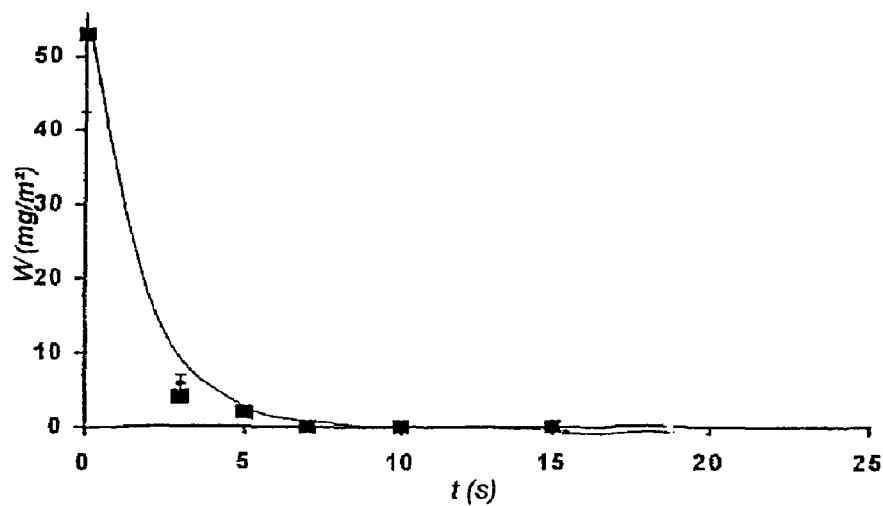
FIG. 7 indicates the change in the residual oil coating weight W as a function of the treatment time on specimens initially coated with 53 mg/m$^2$ of oil.

FIG. 7 shows the change in residual oil covering weight on the specimens taken from the strip with 53 mg/m² of oil after various plasma treatment times, using a frequency of 100 kHz. It may be noted that a time of 3 to 4 seconds is sufficient to clean the strip.

EXAMPLE 2

An oiled and skin-passed mild steel strip was treated so as to clean it using the same reactor and under the same experimental conditions as those described in example 1. The oil covering weight on the strip was 110 mg/m².

The specimens taken from the skin-passed strip were subjected to plasma treatment for various durations. Next, using the method described in example 1, the residual oil covering weight on each treated specimen was measured by grazing incidence infrared absorption spectroscopy (IRRAS).

Figure 8:
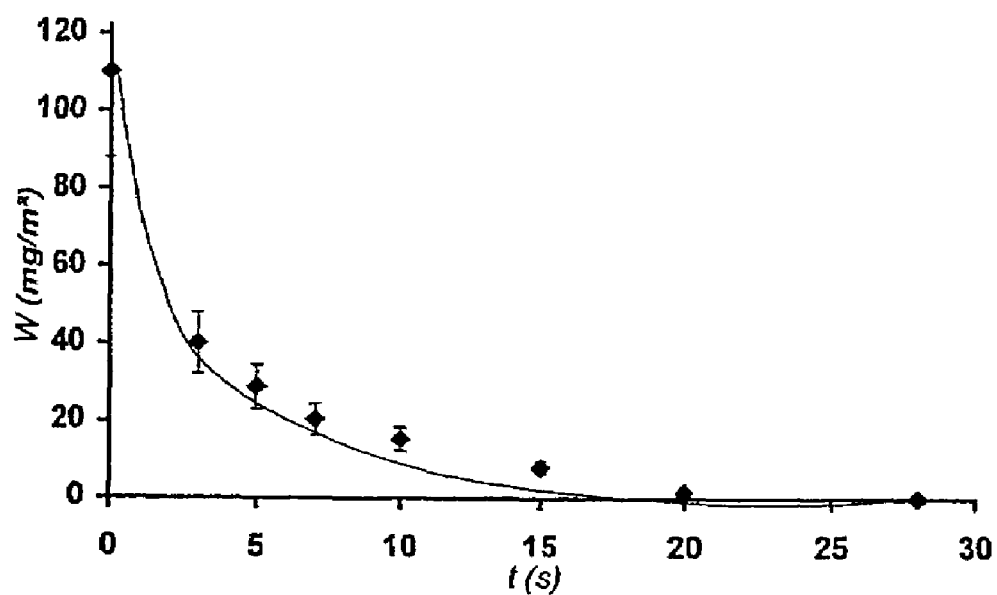
FIG. 8 shows the change in the residual oil coating weight W as a function of the treatment time on specimens initially coated with 110 mg/m$^2$ of oil.

FIG. 8 shows the change in residual oil covering weight on the specimens taken from the strip after various plasma treatment times. It may be noted that a time of 20 seconds is sufficient to clean the strip.

EXAMPLE 3

The trial of example 1 was repeated with the steel strip covered with a 150 mg/m² layer of Quaker TINNOL N200 oil.

The specimens taken from the strip were treated by applying various electric fields to them. The XPS spectra of the surfaces of these specimens, and of control specimens, were obtained and the Fe/C and O/C ratios were calculated by integration of the corresponding peaks.

The results obtained and the test conditions are given in the following table:

|  | Treatment time (s) | Oxygen (l/h) | Fe/C |
|---|---|---|---|
| Oiled control | — | — | 0 |
| Solvent-degreased control | — | — | 0.30 |
| Plasma using a 10 kHz pulsed DC generator | 75<br>180 | 650 | 0.19<br>0.23 |
| Plasma using a 20 kHz pulsed DC generator | 45 | 650 | 0.20 |
| Plasma using a 40 kHz pulsed DC generator | 22 | 650 | 0.26 |
| Plasma using a 100 kHz pulsed DC generator | 10 | 650 | 0.23 |

The higher the Fe/C ratio, the cleaner the surface of the material.

If the three results obtained with the pulsed DC generator are compared, it may be seen that there is a significant improvement in the speed of the degreasing treatment when the positive voltage pulses have a frequency of at least 20 kHz.

Moreover, it may be seen that, for a frequency of 40 kHz, the strip is completely degreased after 22 seconds, whereas at a frequency of 100 kHz no more than 10 seconds are required to achieve the same result.

The invention claimed is:

1. A process for the continuous cleaning of the surface of a material covered with an organic substance, the process comprising:
    introducing said material into a treatment zone supplied with an oxygen-containing gas stream;
    grounding said material and generating a plasma by imposing an electric field between the surface of said material and at least one electrode covered with a dielectric;
    wherein said electric field is pulsed and comprises a succession of positive and negative voltage pulses delivered to the at least one electrode with respect to said material, a maximum voltage of the positive pulses $U^+$ being greater than an arc striking voltage $U_a$ and a maximum voltage of the negative pulses $U^-$ being, in absolute value, less than the striking voltage $U_a$,
    wherein the material is in the form of a running strip.

2. The process as claimed in claim 1, wherein the voltage rise time of said field is less than or equal to 600 ns.

3. The process as claimed in claim 1, wherein the frequency of the positive pulses is greater than or equal to 20 kHz.

4. The process as claimed in claim 1, wherein said gas stream consists of air or oxygen.

5. The process as claimed in claim 1, wherein said material is a metallic material.

6. The process as claimed in claim 5, wherein said material is a carbon steel.

7. The process as claimed in claim 5, wherein said organic substance is an oil for providing temporary corrosion protection or an unstable mechanical emulsion.

* * * * *